United States Patent
Kaneko et al.

(10) Patent No.: US 9,438,018 B2
(45) Date of Patent: Sep. 6, 2016

(54) JUNCTION BOX

(71) Applicant: Yazaki Corporation, Tokyo (JP)

(72) Inventors: Nobutaka Kaneko, Makinohara (JP); Hiroki Tashiro, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 179 days.

(21) Appl. No.: 14/319,039

(22) Filed: Jun. 30, 2014

(65) Prior Publication Data

US 2014/0311793 A1 Oct. 23, 2014

Related U.S. Application Data

(63) Continuation of application No. PCT/JP2013/050866, filed on Jan. 10, 2013.

(30) Foreign Application Priority Data

Jan. 13, 2012 (JP) .................................. 2012-004929

(51) Int. Cl.
*H01R 13/502* (2006.01)
*H02G 3/08* (2006.01)
(Continued)

(52) U.S. Cl.
CPC ........... *H02G 3/081* (2013.01); *B60R 16/0238* (2013.01); *H05K 7/026* (2013.01)

(58) Field of Classification Search
CPC .......... B60R 16/0238; B60R 16/0239; H01H 2085/208; H01R 9/2458; H01R 12/585; H01R 12/523; H01R 13/5227; H02G 3/081; H02G 3/088; H02G 3/086; H05K 1/144; H05K 3/308; H05K 7/026; H05K 2201/10757; H05K 2201/1059; Y10S 439/949

USPC ...... 174/50, 560, 659, 50.52; 439/76.2, 76.1
See application file for complete search history.

(56) References Cited

U.S. PATENT DOCUMENTS

2006/0141820 A1 6/2006 Naito et al.
2007/0240894 A1 10/2007 Sasaki et al.
(Continued)

FOREIGN PATENT DOCUMENTS

CN 1540823 A 10/2004
CN 1823459 A 8/2006
(Continued)

OTHER PUBLICATIONS

International Preliminary Report on Patentability dated Jul. 15, 2014 issued by the International Searching Authority in counterpart International Application No. PCT/JP2013/050866.
(Continued)

*Primary Examiner* — Timothy Thompson
*Assistant Examiner* — Guillermo Egoavil
(74) *Attorney, Agent, or Firm* — Sughrue Mion, PLLC

(57) ABSTRACT

A junction box includes a box body, an upper cover, and a side cover. The box body has a side wall portion, an electric distribution portion, and a drain hole which is located at the inside of the side wall portion. The upper cover has a top panel and a down wall portion which are downwardly provided from the peripheral end of the top panel. The side cover has a terminal connected to the electric distribution portion and a case portion which covers the terminal. A drain groove is provided on an upper face of the case portion along the side wall portion. A downward slope is formed towards the drain hole on a bottom face of the drain groove.

6 Claims, 4 Drawing Sheets

(51) Int. Cl.
*B60R 16/023* (2006.01)
*H05K 7/02* (2006.01)

(56) References Cited

U.S. PATENT DOCUMENTS

| | | |
|---|---|---|
| 2008/0149387 A1 | 6/2008 | Oda |
| 2008/0299800 A1* | 12/2008 | Yoshida ............ H01R 13/5227 439/76.2 |
| 2009/0298310 A1* | 12/2009 | Nakanishi ............ H02G 3/088 439/76.2 |
| 2009/0298311 A1 | 12/2009 | Nakanishi et al. |
| 2010/0288757 A1* | 11/2010 | Akahori ............ B60R 16/0238 220/3.7 |
| 2010/0326692 A1 | 12/2010 | Ozawa et al. |
| 2012/0267162 A1* | 10/2012 | Soh ........................ H05K 7/026 174/659 |

FOREIGN PATENT DOCUMENTS

| | | |
|---|---|---|
| CN | 101032061 A | 9/2007 |
| CN | 101593949 A | 12/2009 |
| CN | 101946381 A | 1/2011 |
| JP | 4111223 U | 9/1992 |
| JP | 2002-58128 A | 2/2002 |
| JP | 2004-236449 A | 8/2004 |
| JP | 2008-154412 A | 7/2008 |
| JP | 2011055630 A | 3/2011 |

OTHER PUBLICATIONS

International Search Report, dated Apr. 24, 2013, issued by the International Searching Authority in counterpart International Application No. PCT/JP2013/050866.

Written Opinion, dated Apr. 24, 2013, issued by the International Searching Authority in counterpart International Application No. PCT/JP2013/050866.

Communication from the State Intellectual Property Office of P.R. China dated Sep. 25, 2015 in a counterpart Chinese application No. 201380005348.3.

Office Action issued on Oct. 27, 2015 by the Japanese Patent Office in counterpart Japanese Application No. 2012-004929.

* cited by examiner

JUNCTION BOX

CROSS REFERENCE TO RELATED APPLICATIONS

This application is a continuation of PCT application No. PCT/JP2013/050866, which was filed on Jan. 10, 2013 based on Japanese Patent Application (No. JP-2012-004929) filed on Jan. 13, 2012, the contents of which are incorporated herein by reference.

BACKGROUND OF THE INVENTION

1. Field of the Invention

The present disclosure relates to a junction box mounted on a vehicle, and particularly to a junction box which includes a side cover attached to a body case.

2. Description of the Related Art

A junction box mounted on a vehicle has various structures depending on the type of the vehicle, but usually has structures including, for example, a box body in which electronic components are mounted (body case), an upper cover which covers the upper part of the box body, a lower cover which covers the lower part of the box body, and a side cover which is attached to a side face of the box body (for example, refer to JP-A-2008-154412 and JP-A-2004-236449).

Inside the box body, a component mounting portion where various electric components such as a large number of fuses or relays are mounted, an electric distribution portion which is connected to power source lines from an external battery or electric wires that are connected to other devices, and internal circuits such as a bus bar or the like which connects the component mounting portion and the electric distribution portion are provided. The electric distribution portion is provided with bolts or the like which are connected to the bus bar.

The side cover has connection terminals such as bus bars that are connected to the power source lines from the battery and the electric wires that are connected to other devices, and a case such as a terminal cover which accommodates these connection terminals, and while the power source lines and the electric wires are extended from the case, the connection terminals are connected to the electric distribution portion of the box body. The side cover is attached when the case of the side cover is locked onto the side face of the box body, and the upper cover is attached by covering the upper end edges of the case. Since the upper cover covers the upper end edges of the case in this way, it can be prevented that water leaks inside the side cover.

SUMMARY OF THE INVENTION

However, in the traditional junction box described in JP-A-2008-154412 and JP-A-2004-236449, only with the upper cover which covers the upper end edges of the case of the side cover, water cannot be sufficiently prevented from leaking inside, and there is a possibility that water which splashes in the engine room may enter into the box body from a gap between the box body and the upper cover. In particular, since the electric distribution portion connected to the power source lines through which a large electric current flows is located at a part where the side cover is attached, it is not preferable that the water which leaks from the part of the side cover reaches the electric distribution portion.

Therefore, the present disclosure is intended to provide a junction box which can prevent water from leaking into the electric distribution portion located inside the box body.

In order to achieve the above object, according to the present disclosure, there is provided a junction box comprising:

a box body that has a component mounting portion for mounting an electric component;

an upper cover that covers an upper part of the box body; and a side cover that is attached to a side face of the box body, wherein the box body has a side wall portion which surrounds the component mounting portion and an electric distribution portion which is electrically connected to the component mounting portion, and a drain hole is located at the inside of the side wall portion;

wherein the upper cover has a top panel and a down wall portion which are downwardly provided from the peripheral end of the top panel;

wherein the side cover has a terminal connected to the electric distribution portion and a case portion which covers the terminal;

wherein a drain groove is provided on an upper face of the case portion along the side wall portion of the box body, and is located farther inwards than the down wall portion of the upper cover from a plan top view; and wherein a downward slope is formed towards the drain hole on a bottom face of the drain groove.

For example, a side wall drain groove is provided in a circumference direction on an upper edge of the side wall portion of the box body except in an area where the side cover is attached, the drain hole is provided on a part of the side wall drain groove, and the drain groove of the side cover and the side wall drain groove of the box body are provided continuously along the circumference direction.

For example, a water stop projecting portion, which is overlapped on the outside of the side wall portion of the box body, is formed continuously along the lower edge of the down wall portion, the drain groove includes an inner wall which is raised along the side wall portion, an outer wall which is raised to the outside opposite to the inner wall, and a bottom face which is provided between the inner wall and the outer wall, and the water stop projecting portion is provided so as to overlap the outside of the outer wall of the drain groove in the area where the side cover is attached.

According to the present disclosure described above, because the drain groove is formed on the upper face of the case portion in the side cover, and the drain groove is located farther inwards than the down wall portion of the upper cover, the water which leaks from the gap between the side cover and the upper cover and the like is received in the drain groove, and the water flows along the side wall portion of the box body (that is, around the box body). Therefore, the water is prevented from leaking toward the electric distribution portion connected to the terminal of the side cover, so that the water can be guided to the direction apart from the electric distribution portion. Because the downward slope toward the drain hole is formed on the bottom face of the drain groove, the water which enters the drain groove flows along the slope to the drain hole, and will be drained from the drain hole to the outside. Therefore, because the water can be drained by being guided in the direction apart from the electric distribution portion by the drain groove formed in the side cover, the water can be prevented leaking into the electric distribution portion.

According to the present disclosure described above, by forming the side wall drain groove, which is continuously provided in the circumference direction on the upper end edge of the side wall portion of the box body, and the drain groove of the side cover continuously along the circumference direction, the water received in the side wall drain groove and the drain groove can be prevented from flowing into the box body, and the water can be surely drained from the drain hole provided in the side wall drain groove to the outside of the box body.

According to the present disclosure described above, the water stop projecting portion which is formed along the bottom edge of the down wall portion of the upper cover is overlapped on the outsides of the side wall portion of the box body, and overlaid on the outside of the outer faces of the drain groove in the side cover, so that the upper end edge of the box body and the side cover can be covered with the water stop projecting portion continuously in the circumference direction, and water can be prevented from leaking into the box body by the water stop projecting portion. Since the outer faces of the drain groove is located inside the water stop projecting portion, a leaking course of water becomes a flexural shape to reduce the flow of the water, and even if the water bypasses the outer faces, the water that is received by the inner face and drops on the bottom face of the drain groove can be drained by being led to the drain hole.

DETAILED DESCRIPTION OF THE EXEMPLARY EMBODIMENTS

Next, a junction box according to one embodiment of the present disclosure is described based on FIGS. 1 to 6. A junction box 1 according to the present embodiment is mounted on a vehicle as a mobile object, and supplies power and transmits signals to electronic devices mounted on the vehicle. In the present disclosure, a junction block (also called a junction box), a fuse block (also called a fuse box), and a relay block (also called a relay box) are collectively referred to as a junction box below.

Figure 1:
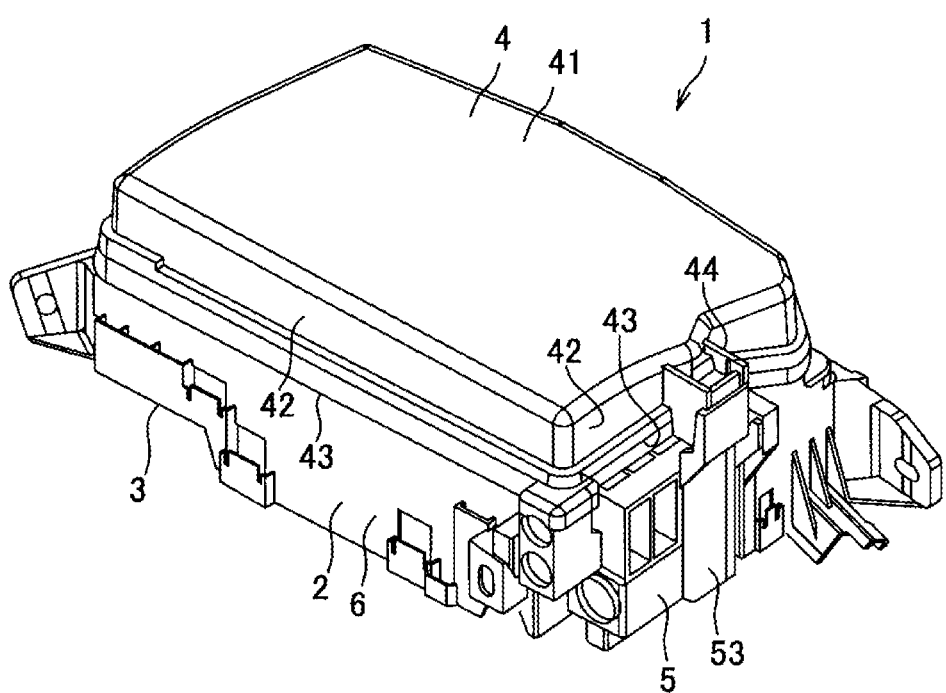
FIG. 1 is a perspective view illustrating a junction box according to one embodiment of the present disclosure.
Figure 2:
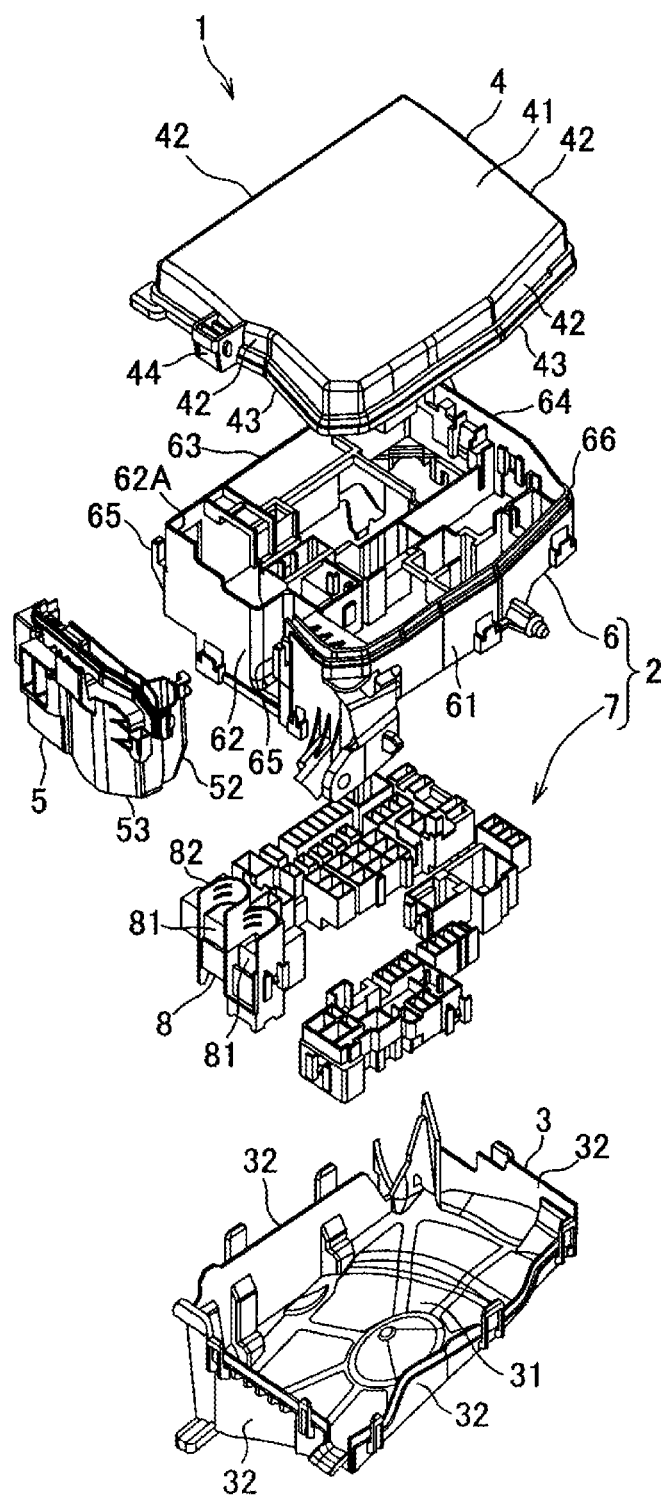
FIG. 2 is an exploded perspective view illustrating the junction box.
Figure 3:
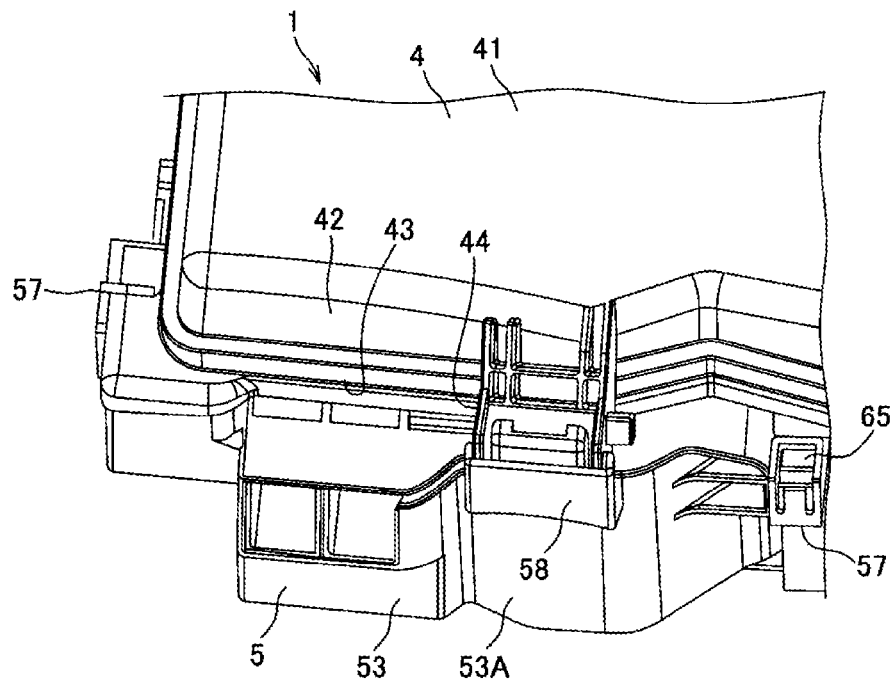
FIG. 3 is a perspective view illustrating a part of the junction box which is enlarged.

As shown in FIGS. 1 to 3, the junction box 1 includes a box body 2, a lower cover 3 which covers the lower part of the box body 2, an upper cover 4 which covers the upper part of the box body 2, and a side cover 5 which is attached onto a side face of the box body 2. The box body 2 includes a body case 6, a plurality of cassette blocks 7 as component mounting portions where a plurality of electric components and/or a plurality of bus bars are mounted, and a junction block 8 as an electric distribution portion where power source lines from external batteries or the like are connected, and the plurality of cassette blocks 7 are accommodated inside the body case 6. The lower cover 3, the upper cover 4, the body case 6 and the cassette blocks 7 are molded of insulating synthetic resin by well-known injection molding, respectively.

The body case 6 is totally formed into a pipe shape in which the inside of the body case 6 is partitioned by a plurality of partition walls, and has side wall portions 61, 62, 63 and 64 which continuously form four borders of the body case. The lower cover 3 is formed into a box shape which opens upwards by having a bottom panel 31, and raised walls 32 which are raised from the peripheral ends of the bottom panel 31 and are connected to the side wall portions 61, 62, 63 and 64 of the body case 6. The upper cover 4 is formed into a box shape which opens downward by having a top panel 41, and down wall portions 42 which are hung down from the peripheral ends of the top panel 41 and are connected to the side wall portions 61, 62, 63 and 64 of the body case 6 and the side cover 5. At the lower edges of the down wall portions 42, a water stop projecting portion 43 which is overlapped on the outsides of the side wall portions 61, 62, 63 and 64 is formed continuously in the circumference direction. A lock portion 44 is formed at the down wall portion 42 along the side wall portion 62 in the down wall portions 42.

The cassette block 7 has a plurality of mounting parts where electric components such as a relay, a fuse or a fusible link are mounted, and an accommodating portion which accommodates bus bars and terminals with electric wires to connect the mounting parts and/or connect the mounting parts and the electric distribution portion. The junction block 8 includes two bolt blocks 81, and a case 82 which accommodates these bolt blocks 81. The bolt block 81 mechanically and electrically connects a bus bar 71 (refer to FIG. 5), which is connected to an electric component of the cassette block 7, and a terminal fitting 51 (refer to FIG. 4) which is accommodated in the side cover 5 and connected to a power source line, and has a bolt 83 which fixes the terminal fitting 51 by fastening a nut not shown in the figures.

Figure 4:
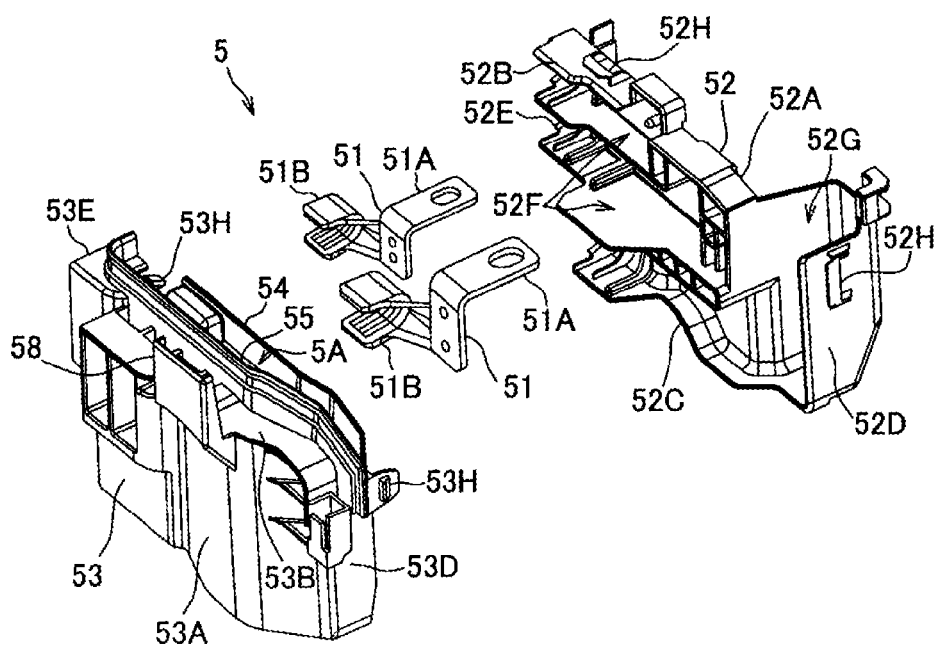
FIG. 4 is an exploded perspective view illustrating a side cover in the junction box.

As shown in FIG. 4, the side cover 5 has a pair of terminal fittings 51 to which power source lines which extend from a power supply such as a battery or an alternator are connected, and a first case 52 and a second case 53 as case portions which cover the terminal fittings 51. The terminal fitting 51 is obtained, for example, by bending a thick metal sheet, and integrally includes a flat board-formed electric contact portion 51A which has a hole into which the bolt 83 is inserted, and an electric wire distribution portion 51B which is connected to the power source line. The electric contact portion 51A is provided to project into the side of the box body 2 from the first case 52, and the electric contact portion 51A that projects in this way is adapted to be connected to the bolt 83 of the bolt block 81.

The first case 52 and the second case 53 are molded of insulating synthetic resin by well-known injection molding, respectively. The first case 52 is formed into a box shape which opens to the side of the second case 53 by having a first side face portion 52A of a side face shape in accordance with the side wall portion 62 of the body case 6, a first upper face portion 52B which extends from the first side face portion 52A to the side of the second case 53, a first bottom face portion 52C, a first front face portion 52D and a first back face portion 52E. In the first case 52, a terminal accommodating portion 52F which accommodates the pair of terminal fittings 51, and a harness insertion portion 52G, into which a wire harness which is connected to the cassette block 7 through a connector or the like is inserted, are formed. In the first side face portion 52A, through holes into which the electric contact portions 51A of the terminal fittings 51 are inserted are formed, and in the first back face portion 52E, a semicircular-formed insertion portion into which the power source lines connected to the electric wire distribution portions 51B are inserted, and a semicircular-formed insertion portion into which the wire harness which passes through the harness insertion portion 52G is inserted are formed.

The second case 53 is formed into a box shape which opens to the side of the first case 52 by having a second side face portion 53A which forms the outer side face of the side cover 5 opposite to the side face portion 52A of the first case 52, a second upper face portion 53B which extends from the second side face portion 53A of the second case 53 to the side of the first case 52, a second bottom face portion (not shown in the figure), a second front face portion 53D and a second back face portion 53E. In the second back face portion 53E, semicircular-formed insertion portions into which the power source lines and the wire harness are respectively inserted are formed together with the insertion portions of the first back face portion 52E. In the second upper face portion 53B, an inner wall 54 which is raised to the side of the first case 52 (that is, to the side of the side wall portion 62 of the body case 6), and an outer wall 55 which is raised to be opposite to the inner wall 54 (that is, the side opposite to the side wall portion 62) are formed. A drain groove 5A has a bottom face 56 (refer to FIGS. 5 and 6) including the second upper face portion 53B located between the inner wall 54 and the outer wall 55, the inner wall 54 and the outer wall 55.

The first case 52 and the second case 53 mentioned above are totally constructed into a box shape when the first upper face portion 52B and the second upper face portion 53B are overlapped with each other, the first bottom face portion 52C and the second bottom face portion are overlapped with each other, the first front face portion 52D and the second front face portion 53D are overlapped with each other, and the first back face portion 52E and the second back face portion 53E abut against each other. By locking lock portions 53H formed on the inner wall 54 of the second case 53 to lock receivers 52H formed on the first upper face portion 52B and the first front face portion 52D, the side cover 5 is formed by attaching the first case 52 and the second case 53 to each other. By fitting cylindrical fitting portions 57 formed at the side of the second front face portion 53D and the side of the second back face portion 53E in the second case 53 into fitting projections 65 (refer to FIG. 2) of the body case 6 from above, the side cover 5 is attached to the box body 2. By engaging a lock piece 58 which is formed by extending upwards from the second side face portion 53A in the second case 53, with a lock portion 44 of the upper cover 4, the upper cover 4 is locked to the box body 2 through the side cover 5.

Figure 5:
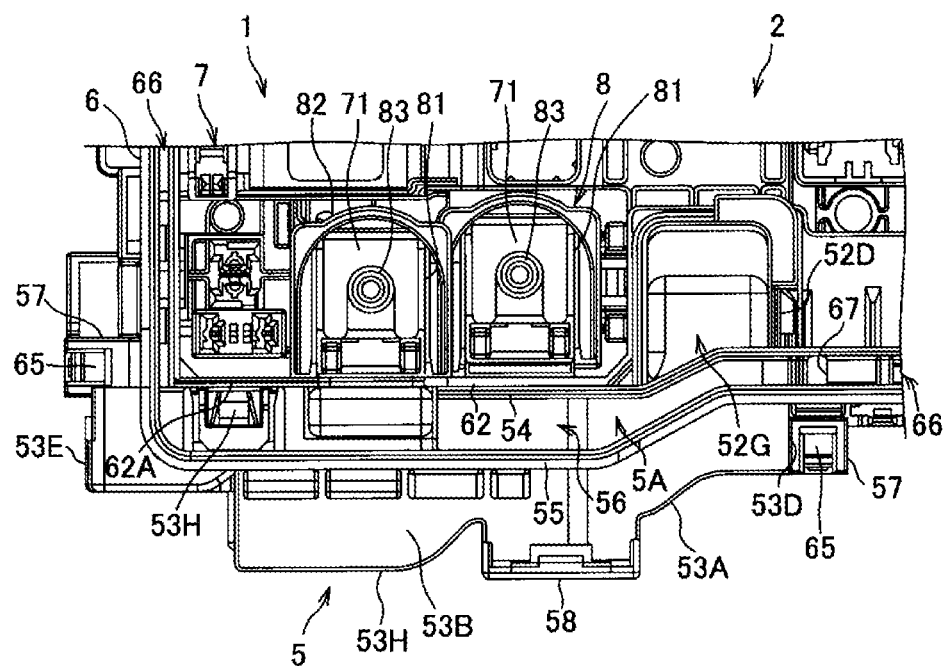
FIG. 5 is a top view illustrating main parts of the junction box.
Figure 6:
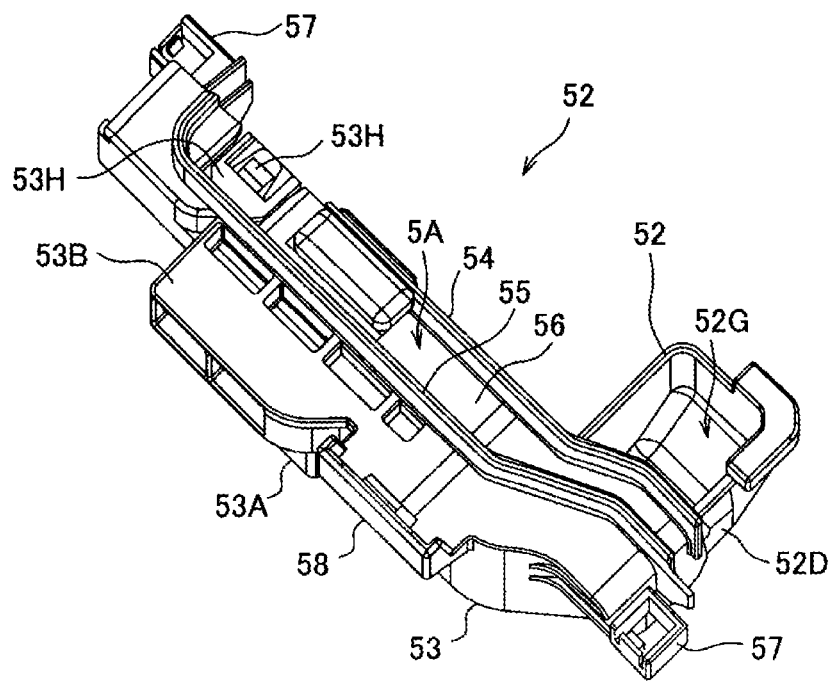
FIG. 6 is a perspective view illustrating the side cover.

Next, a water stop structure and a water drain structure for preventing water or the like from leaking into the box body 2 in the junction box 1 are described. First, when the side cover 5 is assembled to the box body 2, after the cylindrical fitting portions 57 are located above the fitting projections 65 of the body case 6, while the side cover 5 drops, the cylindrical fitting portions 57 are fitted into the fitting projections 65. As shown in FIGS. 2 and 5, in the upper edges of the side wall portions 61, 62, 63 and 64 of the body case 1, a side wall drain groove 66 is formed by a pair of opposed wall portions to the inside and outside of the body case 6. The pair of wall portions to construct the side wall drain groove 66 are formed so that the outer wall portion is lower than the inner wall portion. The side wall drain groove 66 is not formed in a range where the side cover 5 is attached in the side wall portion 62. The drain groove 5A of the side cover 5 located in the range continue the side wall drain groove 66 of the body case 6, and a part (part of the lock portion 53H) where the inner wall 54 of the drain groove 5A is partly cut off can be occupied by a rising edge of the side wall portion 62. Thereby, the drain groove 5A and the side wall drain groove 66 are adapted to be formed into a groove form continuously in the circumference direction.

As shown in FIG. 5, at a position near the first front face portion 52D and the second front face portion 53D of the side cover 5 in the side wall portion 62, a drain hole 67 which penetrates through the bottom face of the side wall drain groove 66 to communicate with the outside of the body case 6 is formed. The drain hole 67 is provided at a position opposite to the junction block 8 to sandwich the harness insertion portion 52G of the side cover 5, namely, a position spaced from the junction block 8 for a predetermined distance. From the side of the back face portion 52E and the second back face portion 53E towards the side of the first front face portion 52D and second front face portion 53D, that is, towards the drain hole 67, a downward slope is formed on the bottom face 56 of the drain groove 5A. At the end of the bottom face 56 of the drain groove 5A at the side of the second front face portion 53D, a down turning curved face portion is formed below which the drain hole 67 is provided.

When the upper cover 4 is attached by covering the upper part of the box body 2 and the side cover 5, the water stop projecting portion 43 is located to overlap the outsides of the outer wall 55 of the drain groove 5A and the outer face of the side wall drain groove 66, that is, the drain groove 5A and the side wall drain groove 66 is adapted to be covered by the down wall portions 42. Therefore, when water is to enter into the junction box 1 from outside, first, the water is prevented from leaking into the box body 2 by the water stop projecting portion 43, and thereby a water stop structure of the junction box 1 is constructed.

On the other hand, even if the water enters into the inside of the side wall drain groove 66 by bypassing the lower part of the water stop projecting portion 43, this water is guided along the side wall drain groove 66 to the drain hole 67, and is drained to the outside of the box body 2 from the drain hole 67. Even if the water enters from the gap between the water stop projecting portion 43 and the outer wall 55 of the side cover 5, this water is received by the drain groove 5A, and is prevented from leaking into the side of the junction block 8. The water received in the drain groove 5A flows to the side of the second front face portion 53D along the slope formed on the bottom face 56 of the drain groove 5A, drops towards the drain hole 67 from the end of the slope, and is drained to the outside of the box body 2 from the drain hole 67. The water drain structure of the junction box 1 is constructed as above, and with this water drain structure, water may not leak into the cassette blocks 7 and/or the junction block 8 inside the box body 2.

According to the present embodiment, the water stop projecting portion 43 is continuously formed in the circumference direction at the down wall portions 42 of the upper cover 4, and since the water stop structure in which the outsides of the drain groove 5A and the side wall drain groove 66 are covered by the water stop projecting portion 43 is provided, water can be prevented from leaking into the box body 2. Because the drain groove 5A is formed in the side cover 5, and the drain groove 5A is provided with the downward slope towards the drain hole 67, the water which leaks from the gap between the side cover 5 and the upper cover 4 or the like can be received in the drain groove 5A, and guided towards the drain hole 67, and the water can be prevented from leaking into the junction block 8 which is an electric distribution portion. Because the side wall drain groove 66 is formed in the upper edges of the side wall portions 61, 62, 63 and 64 of the body case 6, and the side wall drain groove 66 and the drain groove 5A of the side cover 5 are formed continuously in the circumference direction, the water received in the side wall drain grooves 66 and the drain groove 5A can be prevent from flowing to the cassette blocks 7 and/or the junction block 8 located inside the box body 2, and the water can be surely drained from the drain hole 67 to the outside of the box body 2.

The above described embodiments are only representative embodiments of the present disclosure, and the present disclosure is not limited to the above embodiments. That is, various modifications can be made without departing from the spirit and scope of the present disclosure.

For example, in the above-mentioned embodiment, the junction box 1 includes the box body 2 and the lower cover 3, but the lower cover 3 may be constructed integrally with the body case 6. Furthermore, the box body 2 is not limited to be constructed separately by the body case 6, the cassette block 7 and the junction block 8, but all these parts may be formed integrally. In the above-mentioned embodiment, the drain groove 5A is formed in the second case 53 of the side cover 5, but the drain groove may be formed in the first case 52. Furthermore, the side cover 5 is not limited to include the first case 52 and the second case 53, but the terminal metal fittings 51 may be embedded in an integral case.

In the embodiment, the junction block 8, which is an electric distribution portion and the drain hole 67 are provided to be separated from each other to sandwich the harness insertion portion 52G formed in the side cover 5, but the part to separate the electric distribution portion and the drain hole is not limited to be formed in the side cover, but may be provided in the box body 2. Furthermore, the part to separate the electric distribution portion and the drain hole is not limited to the harness insertion portion 52G, but may be a part which is not heavily influenced even if water enters or a part where appropriate waterproofing is performed.

By the present disclosure, a junction box which prevents water from leaking into an electric distribution portion located inside a box body can be obtained.

What is claimed is:

1. A junction box comprising:
  a box body that has a component mounting portion for mounting an electric component;
  an upper cover that covers an upper part of the box body; and
  a side cover that is externally attached to a side face of the box body,
  wherein the box body has a side wall portion which surrounds the component mounting portion and an electric distribution portion which is electrically connected to the component mounting portion, and a drain hole is located at the inside of the side wall portion;
  wherein the upper cover has a top panel and a down wall portion which are downwardly provided from the peripheral end of the top panel;
  wherein the side cover has a terminal connected to the electric distribution portion and a case portion which covers the terminal;
  wherein a drain groove is provided on an upper face of the case portion along the side wall portion of the box body, and is located farther inwards than the down wall portion of the upper cover from a plan top view; and
  wherein a downward slope is formed towards the drain hole on a bottom face of the drain groove.

2. The junction box according to claim 1, wherein a side wall drain groove is provided in a circumference direction on an upper edge of the side wall portion of the box body except in an area where the side cover is attached;
  wherein the drain hole is provided on a part of the side wall drain groove; and
  wherein the drain groove of the side cover and the side wall drain groove of the box body are provided continuously along the circumference direction.

3. The junction box according to claim 1, wherein a water stop projecting portion, which is overlapped on the outside of the side wall portion of the box body, is formed continuously along the lower edge of the down wall portion;
  wherein the drain groove includes an inner wall which is raised along the side wall portion, an outer wall which is raised to the outside opposite to the inner wall, and a bottom face which is provided between the inner wall and the outer wall; and
  wherein the water stop projecting portion is provided so as to overlap the outside of the outer wall of the drain groove in the area where the side cover is attached.

4. A junction box comprising:
  a box body that has a component mounting portion for mounting an electric component;
  an upper cover that covers an upper part of the box body; and
  a side cover that is attached to a side face of the box body,
  wherein the box body has a side wall portion which surrounds the component mounting portion and an electric distribution portion which is electrically connected to the component mounting portion, and a drain hole is located at the inside of the side wall portion;
  wherein the upper cover has a top panel and a down wall portion which are downwardly provided from the peripheral end of the top panel;
  wherein the side cover has a terminal connected to the electric distribution portion and a case portion which covers the terminal;
  wherein a drain groove is provided on an upper face of the case portion along the side wall portion of the box body, and is located farther inwards than the down wall portion of the upper cover from a plan top view;
  wherein a downward slope is formed towards the drain hole on a bottom face of the drain groove;
  wherein a side wall drain groove is provided in a circumference direction on an upper edge of the side wall portion of the box body except in an area where the side cover is attached;
  wherein the drain hole is provided on a part of the side wall drain groove; and
  wherein the drain groove of the side cover and the side wall drain groove of the box body are provided continuously along the circumference direction.

5. The junction box according to claim 4, wherein a water stop projecting portion, which is overlapped on the outside of the side wall portion of the box body, is formed continuously along the lower edge of the down wall portion;
  wherein the drain groove includes an inner wall which is raised along the side wall portion, an outer wall which is raised to the outside opposite to the inner wall, and a bottom face which is provided between the inner wall and the outer wall; and
  wherein the water stop projecting portion is provided so as to overlap the outside of the outer wall of the drain groove in the area where the side cover is attached.

6. A junction box comprising:
  a box body that has a component mounting portion for mounting an electric component;

an upper cover that covers an upper part of the box body; and a side cover that is attached to a side face of the box body, wherein the box body has a side wall portion which surrounds the component mounting portion and an electric distribution portion which is electrically connected to the component mounting portion, and a drain hole is located at the inside of the side wall portion;

wherein the upper cover has a top panel and a down wall portion which are downwardly provided from the peripheral end of the top panel;

wherein the side cover has a terminal connected to the electric distribution portion and a case portion which covers the terminal;

wherein a drain groove is provided on an upper face of the case portion along the side wall portion of the box body, and is located farther inwards than the down wall portion of the upper cover from a plan top view;

wherein a downward slope is formed towards the drain hole on a bottom face of the drain groove;

wherein a water stop projecting portion, which is overlapped on the outside of the side wall portion of the box body, is formed continuously along the lower edge of the down wall portion;

wherein the drain groove includes an inner wall which is raised along the side wall portion, an outer wall which is raised to the outside opposite to the inner wall, and a bottom face which is provided between the inner wall and the outer wall; and wherein the water stop projecting portion is provided so as to overlap the outside of the outer wall of the drain groove in the area where the side cover is attached.

\* \* \* \* \*